(12) United States Patent
Hwang et al.

(10) Patent No.: US 8,772,121 B2
(45) Date of Patent: Jul. 8, 2014

(54) PHASE CHANGE MEMORY DEVICES AND METHODS OF MANUFACTURING THE SAME

(75) Inventors: Kyu-Man Hwang, Hwaseong-si (KR); Jun-Soo Bae, Hwaseong-si (KR); Sung-Un Kwon, Jeonju-si (KR); Kwang-Ho Park, Bucheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 115 days.

(21) Appl. No.: 13/443,132

(22) Filed: Apr. 10, 2012

(65) Prior Publication Data

US 2012/0273741 A1 Nov. 1, 2012

(30) Foreign Application Priority Data

Apr. 26, 2011 (KR) ........................ 10-2011-0038865

(51) Int. Cl.
*H01L 21/20* (2006.01)
*H01L 21/8222* (2006.01)
*H01L 29/02* (2006.01)
*H01L 47/00* (2006.01)
*H01L 29/40* (2006.01)
*H01L 29/768* (2006.01)

(52) U.S. Cl.
USPC ........... 438/385; 438/381; 438/382; 438/383; 438/384; 438/329; 438/330; 257/2; 257/245; 257/246; 257/247; 257/248

(58) Field of Classification Search
USPC .......................... 438/54, 102, 384
See application file for complete search history.

(56) References Cited

U.S. PATENT DOCUMENTS

| 7,589,344 B2 | 9/2009 | Sato |
| 2008/0237565 A1 | 10/2008 | Chang |
| 2009/0127653 A1 | 5/2009 | Ryu et al. |

FOREIGN PATENT DOCUMENTS

| JP | 2007-035683 | 2/2007 |
| KR | 10-2008-0088955 A | 10/2008 |
| KR | 10-2009-0052571 A | 5/2009 |

*Primary Examiner* — Steven Loke
*Assistant Examiner* — Juanita B Rhodes
(74) *Attorney, Agent, or Firm* — Lee & Morse, P.C.

(57) ABSTRACT

A method of manufacturing a phase change memory device includes forming a lower electrode layer pattern and an insulating interlayer covering the lower electrode layer pattern, forming a first opening in the insulating interlayer to expose the lower electrode layer pattern, forming an oxide layer pattern on the sidewall of the first opening and a lower electrode under the oxide layer pattern by partially removing the oxide layer and the lower electrode layer pattern, forming an insulation layer filling a remaining portion of the first opening, removing the oxide layer pattern by a wet etching process to form a second opening, and forming a phase change material pattern on the lower electrode such that the phase change material pattern fills the second opening.

14 Claims, 17 Drawing Sheets

PHASE CHANGE MEMORY DEVICES AND METHODS OF MANUFACTURING THE SAME

CROSS-REFERENCE TO RELATED APPLICATION

Korean Patent Application No. 10-2011-0038865 filed on Apr. 26, 2011, in the Korean Intellectual Property Office (KIPO), and entitled: "Phase Change Memory Devices and Methods of Manufacturing the Same," is incorporated by reference herein in its entirety.

BACKGROUND

In a phase change memory device, data may be stored using a resistance difference generated when a phase change material pattern undergoes a phase transition between amorphous state and crystalline state. When a reset current or a set current flows through a lower electrode, a Joule heat may be produced at the lower electrode to be transferred into the phase change material pattern.

SUMMARY

Embodiments may be realized by providing a method of manufacturing a phase change memory device that includes forming a lower electrode layer pattern on a substrate, forming an insulating interlayer covering the lower electrode layer pattern on the substrate, partially removing the insulating interlayer to form a first opening and the first opening exposes the lower electrode layer pattern, forming an oxide layer on the lower electrode layer pattern and on a sidewall of the first opening, partially removing the oxide layer and the lower electrode layer pattern to form an oxide layer pattern on the sidewall of the first opening and a lower electrode under the oxide layer pattern, forming an insulation layer filling a remaining portion of the first opening on the substrate, removing the oxide layer pattern by a wet etching process to form a second opening, the second opening exposing a top surface of the lower electrode, and forming a phase change material pattern on the lower electrode such that the phase change material pattern fills the second opening.

The wet etching process may be performed using an etching solution that has a higher etching rate for the oxide layer pattern than for the insulating interlayer and the insulation layer. The etching solution may include a hydrofluoric acid solution or a buffer oxide etchant solution. The insulating interlayer and the insulation layer may be formed using a silicon nitride or a silicon oxynitride.

The method may include forming a plurality of conductive patterns on the substrate such that at least one pair of neighboring conductive patterns are formed on the substrate. The lower electrode layer pattern may be formed on portions of the pair of neighboring conductive patterns and on a portion of the substrate between the pair of neighboring conductive patterns. Partially removing the oxide layer and the lower electrode layer pattern may expose the portions of the pair of neighboring conductive patterns and the portion of the substrate between the pair of neighboring conductive patterns.

Forming the plurality of conductive patterns may include forming a barrier metal layer pattern on the substrate such that the barrier metal layer pattern has a cup shape, and forming a metal layer pattern on the barrier metal layer pattern such that a sidewall and a bottom surface of the metal layer pattern are surrounded by the barrier metal layer pattern. The lower electrode may be in contact with a top surface of the metal layer pattern. Forming the lower electrode layer pattern may include forming a first conductive layer on the substrate and the first conductive layer includes a metal nitride or a metal silicon nitride, forming a second conductive layer on the first conductive layer and the second conductive layer includes a metal, and partially etching the first conductive layer and the second conductive layer.

Embodiments may also be realized by providing a phase change memory device that includes a lower electrode having a first pattern on a substrate and the first pattern includes a metal nitride or a metal silicon nitride, and a second pattern on the first pattern and the second pattern includes a metal. The device also includes a phase change material pattern on the lower electrode and an upper electrode on the phase change material pattern.

The lower electrode may further include a third pattern on the second pattern, the third pattern may include a second metal nitride or a second metal silicon nitride, and the third pattern may have a same width as the second pattern. The lower electrode may further include a fourth pattern on the third pattern, the fourth pattern may include a second metal, and the fourth pattern may have the same width as the third pattern.

The device may include a conductive pattern on the substrate, the lower electrode may be on the conductive pattern, and a width of the lower electrode may be smaller than a width of the conductive pattern. The lower electrode may be one of a plurality of lower electrodes and the phase change material pattern may be one of a plurality of phase change material patterns. The lower electrodes may have a same height. The phase change material patterns may have a same height.

Embodiments may also be realized by providing a method of manufacturing a phase change memory device that includes providing a substrate and the substrate has a pair of adjacent conductive patterns thereon, forming an insulating interlayer including a first opening and the first opening exposes portions of the pair of adjacent conductive patterns or a lower electrode layer pattern on the substrate that overlaps the portions of the pair of adjacent conductive patterns, forming oxide layer patterns on a sidewall of the first opening such that each oxide layer pattern overlaps one of the pair of adjacent conductive patterns, forming an insulation layer on the oxide layer patterns such that the insulation layer fills the first opening, removing the oxide layer patterns by a wet etching process to form second openings, and filling the second openings with a phase change material to form phase change material patterns on the substrate.

The insulation layer may be formed to abut the oxide layer patterns in the first opening such that the insulation layer and the oxide layer patterns completely fill the first opening. The first opening may be filled with the oxide layer patterns and the insulation layer before the second openings are formed. Before forming the insulation layer, forming the oxide layer patterns may include forming an oxide layer in the first opening, the oxide layer may cover a bottom surface of the first opening and the sidewall of the first opening, and partially removing the oxide layer such that the oxide layer patterns on the sidewall of the first opening remains. A width of the first opening may be greater than a width of the second opening.

Embodiments may also be realized providing an opening exposing a lower electrode layer formed through an insulating interlayer and an oxide layer formed on an inner wall of the opening. The oxide layer and the lower electrode layer are partially etched by an etch-back process to form an oxide layer pattern on a sidewall of the opening and a lower electrode having a smaller cross-section area. An insulation layer filling a remaining portion of the opening is formed and the oxide layer pattern is removed by a wet etching process to expose a top surface of the lower electrode without damages thereof. A phase change material pattern is formed on the exposed lower electrode.

BRIEF DESCRIPTION OF THE DRAWINGS

Features will become apparent to those of ordinary skill in the art by describing in detail exemplary embodiments with reference to the attached drawings in which.

Figure 1:
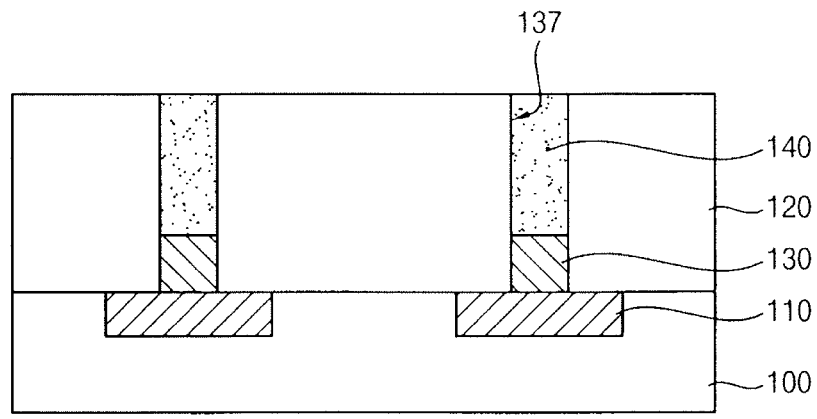
FIG. 1 illustrates a cross-sectional view of a phase change structure in accordance with exemplary embodiments.

It should be noted that these figures are intended to illustrate the general characteristics of methods, structure, and/or materials utilized in certain exemplary embodiments and to supplement the written description provided below. These drawings are not, however, to scale and may not precisely reflect the precise structural or performance characteristics of any given embodiment, and should not be interpreted as defining or limiting the range of values or properties encompassed by exemplary embodiments.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Other words used to describe the relationship between elements or layers should be interpreted in a like fashion (e.g., "between" versus "directly between," "adjacent" versus "directly adjacent," "on" versus "directly on").

In the drawing figures, the dimensions of layers and regions may be exaggerated for clarity of illustration. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, e.g., of manufacturing techniques and/or tolerances, may be expected. Thus, exemplary embodiments should not be construed as limited to the particular shapes of regions illustrated herein but are to include deviations in shapes that result, e.g., from manufacturing. For example, an implanted region illustrated as a rectangle will may have rounded or curved features and/or a gradient of implant concentration at its edges rather than a binary change from implanted to non-implanted region. A buried region formed by implantation may result in some implantation in the region between the buried region and the surface through which the implantation takes place. Thus, the regions illustrated in the figures are schematic in nature.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Phase Change Structures and Methods of Forming the Same

FIG. 1 illustrates a cross-sectional view of a phase change structure in accordance with exemplary embodiments.

Referring to FIG. 1, the phase change structure may include a lower electrode 130 and a phase change material pattern 140 sequentially stacked on a substrate 100. The substrate 100 may include a conductive pattern 110 that is under the lower electrode 130 and the phase change material pattern 140. The conductive pattern 110 may be buried in the substrate 100 or may be formed on the substrate 100. The phase change structure may further include an upper electrode (not illustrated) formed on the phase change material pattern 140.

The substrate 100 may include a semiconductor substrate. For example, the substrate 100 may include a silicon substrate, a germanium substrate, a silicon-germanium substrate, a silicon-on-insulator (SOI) substrate, a germanium-on-insulator (GOI) substrate, etc. The substrate 100 may include lower structures (not illustrated) such as an electrode, a contact, a switching device, an insulation pattern, etc.

The conductive pattern 110 may include a metal such as tungsten (W), aluminum (Al), copper (Cu), tantalum (Ta), titanium (Ti), molybdenum (Mo), niobium (Nb), zirconium (Zr), etc., or a nitride of at least one of these metals.

The phase change structure may be formed through an insulating interlayer 120 that may be &allied on the substrate 100 and the conductive pattern 110. The phase change structure may be formed in a second opening 137, discussed below, in the insulating interlayer 120, e.g., both the lower electrode 130 and the phase change material pattern 140 may be within and/or completely within the opening 137. The lower electrode 130 and the phase change material pattern 140 may be surrounded, e.g., completely surrounded, by the insulating interlayer 120. The insulating interlayer 120 may be formed directly on the substrate 100 and the conductive pattern 110. The insulating interlayer 120 may include at least one of a silicon nitride and a silicon oxynitride.

The lower electrode 130 may make contact with the conductive pattern 110, e.g., may be directly on a center portion of the conductive pattern 110. In exemplary embodiments, the lower electrode 130 may have a uniform upper surface. For example, the upper surface of the lower electrode 130 may be substantially flat, even, and/or planar. For example, the upper surface of the lower electrode 130 may not be substantially etched during a process of forming the phase change material pattern 140 thereon.

The lower electrode 130 may serve as a heater that may convert a current into a heat, e.g., a Joule heater. For an efficiency of the conversion, the lower electrode 130 may have a small contact area with the conductive pattern 110. In an exemplary embodiment, the lower electrode 130 may have a width of about 10 nm to about 20 nm. The width may be measured in a direction between adjacent lower electrodes 130. The conductive pattern 110 may have a width that is greater than a width of the lower electrode 130.

In exemplary embodiments, a plurality of the phase change structures may be formed on the substrate 100. Adjacent phase change structures may be spaced apart by the insulating interlayer 120 and each of the phase change structures may include one of the lower electrodes 130. The lower electrodes 130 of the phase change structures may have a height substantially the same as each other, e.g., a distance between upper surfaces of the lower electrodes 130 and upper surfaces of the respective underlying conductive patterns 110 may be substantially the same in each of the phase change structures.

The lower electrode 130 may include, e.g., a metal nitride or a metal silicon nitride having a resistivity substantially larger than that of a metal. For example, the lower electrode 130 may include at least one of a titanium nitride, a titanium silicon nitride, a tungsten nitride, a tungsten silicon nitride, a tantalum nitride, a tantalum silicon nitride, a zirconium nitride, a zirconium silicon nitride, etc. These may be used alone or in a mixture thereof. In exemplary embodiments, the lower electrode 130 may include a titanium nitride or a titanium silicon nitride.

The phase change material pattern 140 may be disposed on the lower electrode 130 to make contact with the upper surface of the lower electrode 130. In exemplary embodiments, the phase change material pattern 140 may have a uniform bottom surface because the lower electrode 130 may have the uniform upper surface.

In exemplary embodiments, the phase change material pattern 140 may have a width substantially the same as that of the lower electrode 130. For example, the phase change material pattern 140 may completely overlap the lower electrode 130 and the lower electrode 130 may completely overlap the phase change material pattern 140. In an exemplary embodiment, the phase change material pattern 140 may have a width of about 10 nm to about 20 nm. The width may be measured in a direction between adjacent phase change material patterns 140. The phase change material pattern 140 may have a substantially vertical sidewall relative to a top surface of the substrate 100. That is, the phase change material pattern 140 may have a uniform width from a top portion to a bottom portion thereof.

As mentioned above, a plurality of the phase change structures may be formed on the substrate 100. The phase change material patterns 140 of the phase change structures may have a thickness or a height substantially the same as each other. Each of the phase change structures may include one of the phase change material patterns 140. The phase change material patterns 140 of the phase change structures may have a height substantially the same as each other, e.g., a distance between upper surfaces and lower surfaces of the phase change material patterns 140 may be substantially the same in each of the phase change structures.

The phase change material pattern 140 may include a phase change material such as a chalcogen compound, e.g., GeSbTe (GST) or a chalcogen compound doped with carbon, nitrogen and/or a metal.

As described above, the lower electrode 130 may have a small width so that the phase change material pattern 140 may be efficiently heated. Further, the lower electrode 130 and the phase change material pattern 140 may have a width substantially the same as each other so that the heat generated from the lower electrode 130 may be transferred uniformly to the entire phase change material pattern 140. Furthermore, the phase change material patterns 140 may have uniform width and thickness so that variations or distributions of current and/or resistance may be minimized.

FIGS. 2 to 9 illustrate cross-sectional views depicting exemplary stages in methods of forming a phase change structure in accordance with exemplary embodiments.

Figure 2:
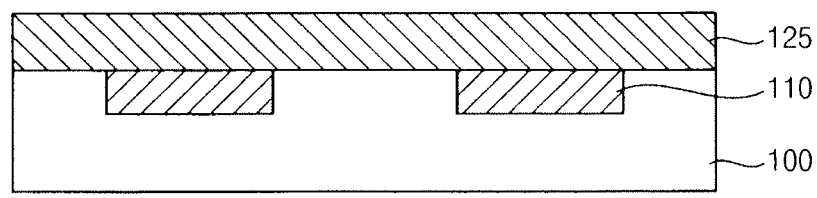
FIGS. 2 to 9 illustrate cross-sectional views depicting stages in methods of forming a phase change structure in accordance with exemplary embodiments.

Referring to FIG. 2, a lower electrode layer 125 may be formed on a substrate 100 including a conductive pattern 110. For example, the substrate 100 may include a plurality of trenches spaced apart on an upper surface thereof. Each of the trenches may be filled with the conductive pattern 110. In exemplary embodiments, the lower electrode layer 125 may be formed using a metal nitride or a metal silicon nitride having a relatively large resistivity by, e.g., at least one of an atomic layer deposition (ALD) process, a sputtering process, a physical vapor deposition (PVD) process, etc. For example, the lower electrode layer 125 may be formed using a titanium nitride, a titanium silicon nitride, a tungsten nitride, a tungsten silicon nitride, a tantalum nitride, a tantalum silicon nitride, a zirconium nitride, a zirconium silicon nitride, etc.

Figure 3:
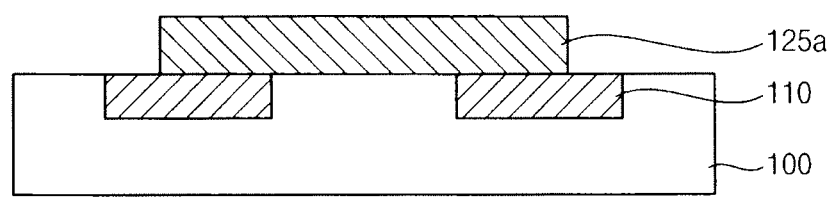

Referring to FIG. 3, a mask pattern (not illustrated) may be formed on the lower electrode layer 125 and the lower electrode layer 125 may be partially etched using the mask pattern as an etching mask to form a lower electrode layer pattern 125a. The lower electrode layer pattern 125a may be formed on, e.g., in an overlapping relationship with, portions of the two neighboring conductive patterns 110 and a portion of the substrate 100 therebetween.

Figure 4:
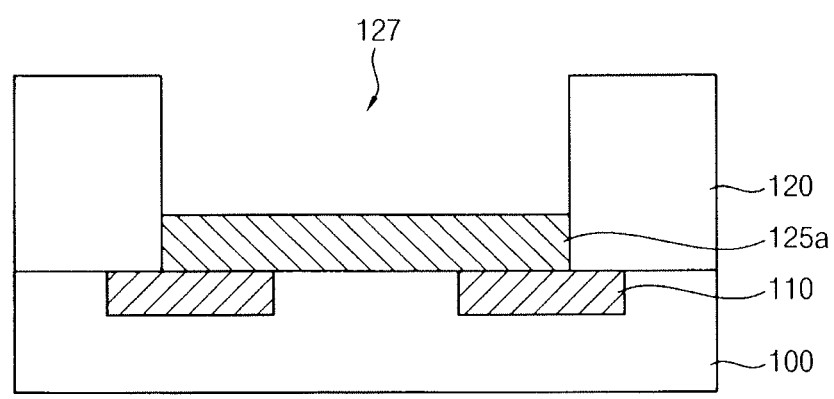

Referring to FIG. 4, an insulating interlayer 120 covering the lower electrode layer pattern 125a may be formed on the substrate 100 and the conductive pattern 110.

In exemplary embodiments, the insulating interlayer 120 may be formed using a silicon nitride or a silicon oxynitride by, e.g., at least one of a chemical vapor deposition (CVD) process, a low pressure chemical vapor deposition (LPCVD) process, a plasma enhanced chemical vapor deposition (PECVD) process, a high density plasma chemical vapor deposition (HDP-CVD) process, etc.

A photoresist pattern (not illustrated) may be formed on the insulating interlayer 120 and the insulating interlayer 120 may be partially removed using the photoresist pattern as an etching mask to form a first opening 127. The first opening 127 may expose a top surface of the lower electrode layer pattern 125a. For example, the first opening 127 may expose the entire top surface of the lower electrode layer pattern 125a and lateral ends of the remaining portions of the insulating interlayer 120 may abut the lateral ends of the lower electrode layer pattern 125a.

Figure 5:
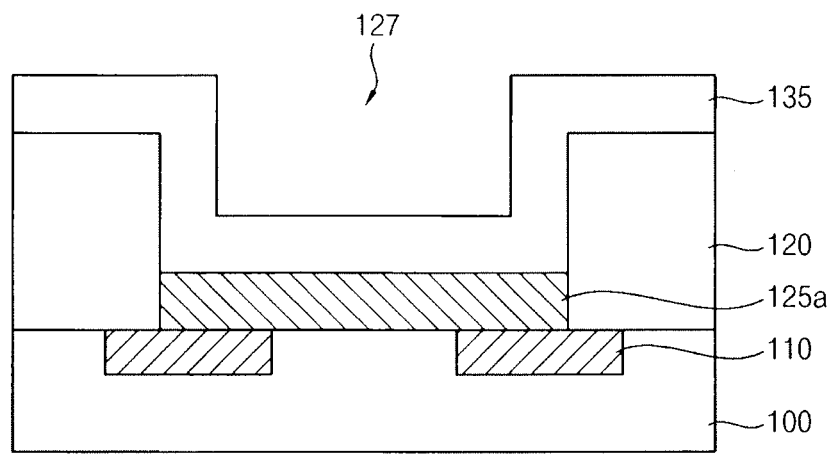

Referring to FIG. 5, an oxide layer 135 may be formed on the lower electrode layer pattern 125a, a sidewall of the first opening 127, and the insulating interlayer 120. The oxide layer 135 may fill a portion of the first opening 127 but may not completely fill the first opening 127.

In exemplary embodiments, the oxide layer 135 may have a uniform thickness ranging from about 10 nm to about 20 nm.

In exemplary embodiments, the oxide layer 135 may be formed using silicon oxide such as at least one of borophosphosilicate glass (BPSG), phosphosilicate glass (PSG), undoped silicate glass (USG), spin on glass (SOG), flowable oxide (FOX), tetra ethyl ortho silicate (TEOS), plasma enhanced-tetra ethyl ortho silicate (PE-TEOS), high density plasma-chemical vapor deposition (HDP-CVD) oxide, etc. The oxide layer 135 may be obtained by, e.g., at least one of a CVD process, an LPCVD process, a PECVD process, an HDP-CVD process, etc.

Figure 6:
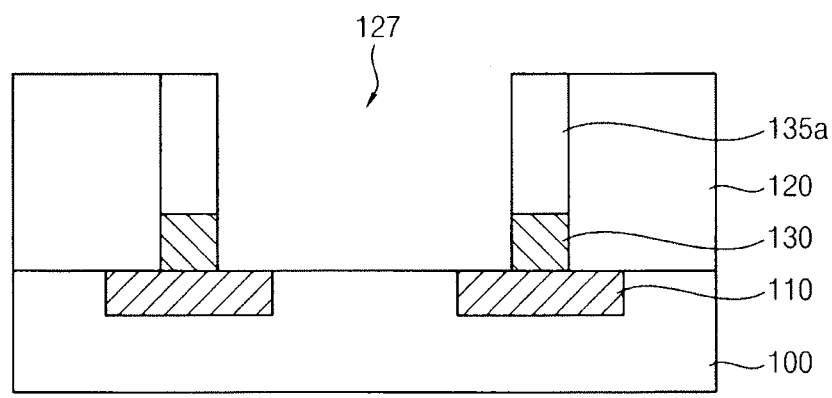

Referring to FIG. 6, portions of the oxide layer 135 formed on a top surface of the insulating interlayer 120 and on the lower electrode layer pattern 125a may be removed by an etch-back process. Accordingly, the oxide layer 135 may remain on the sidewall of the first opening 127. A portion of the lower electrode layer pattern 125a exposed when the portions of the oxide layer 135 are removed may be also removed by the etch-back process. Thus, portions of the neighboring conductive patterns 110 and portions the substrate 100 therebetween may be partially exposed. Further, an upper surface of the insulating interlayer 120 may be exposed. An upper portion of the insulating interlayer 120 may be also partially removed during the etch-back process.

An oxide layer pattern 135a may be formed on the sidewall of the first opening 127 by partially removing the oxide layer 135. A lower electrode 130 may be formed between the conductive layer pattern 110 and a bottom of the oxide layer pattern 135a by partially removing the lower electrode layer pattern 125a. The oxide layer pattern 135a and the lower electrode 130 may be formed by the etch-back process, and not by a photolithography process. Lateral sides of the oxide layer pattern 135a may be vertically aligned, e.g., may form a continuous side surface, with respective adjacent lateral sides of the lower electrode 130. Thus, the oxide layer pattern 135a and the lower electrode 130 may be formed to have a small width without a limitation of a resolution of the photolithography process. In one exemplary embodiment, the oxide layer pattern 135a and the lower electrode 130 may have a width of 10 nm to about 20 nm. The oxide layer pattern 135a and the lower electrode 130 may have a same width within the range of about 10 nm to about 20 nm.

Figure 7:
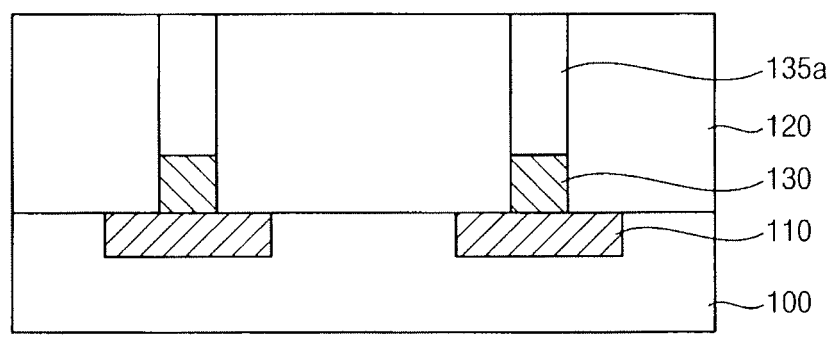

Referring to FIG. 7, an insulation layer filling the first opening 127 may be formed on the substrate 100, the conductive pattern 110, the insulating interlayer 120 and the oxide layer pattern 135a. The insulation layer may be forming using a same material as used to form the insulating interlayer 120 so that the insulation layer may be a part of the insulating interlayer 120.

The insulation layer may be formed using a silicon nitride or a silicon oxynitride by, e.g., at least one of a CVD process, an LPCVD process, a PECVD process, an HDP-CVD process, etc. In exemplary embodiments, the insulation layer may be formed using a material substantially the same as that of the insulating interlayer 120. The insulation layer may be merged with the insulating interlayer 120.

An upper portion of the insulation layer may be planarized until top surfaces of the insulating interlayer 120 and the oxide layer pattern 135a are exposed by, e.g., a chemical mechanical polishing (CMP) process or an etch-back process.

Figure 8:
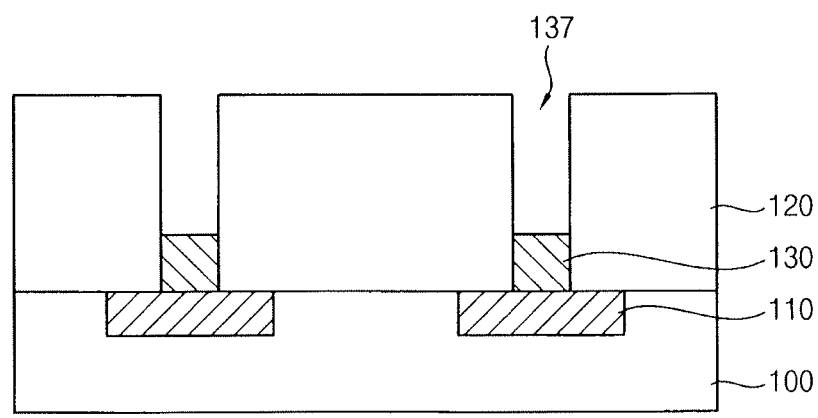

Referring to FIG. 8, the oxide layer pattern 135a may be removed to form second openings 137 exposing the top surface of the lower electrode 130. A width of the second openings 137 may be greater than a width of the first opening 127. For example, two second openings 137 may be formed in a partial area of where the first opening 127 was previously formed.

In exemplary embodiments, the oxide layer pattern 135a may be removed by a wet etching process using an etching solution that has an etching selectivity with respect to the oxide layer pattern 135a including silicon oxide. For example, the etching solution may include a mixed solution of ammonium fluoride and hydrofluoric acid (a LAL solution), a hydrofluoric acid (HF) solution, or a buffer oxide etchant (BOE) solution. The etching solutions may have a very high etching selectivity with respect to the insulating interlayer 120 including a silicon nitride or a silicon oxynitride so that the oxide layer pattern 135a may be selectively removed without damaging the insulating interlayer 120. Therefore, the second opening 137 may have a uniform width from a top portion to a bottom portion thereof.

Figure 9:
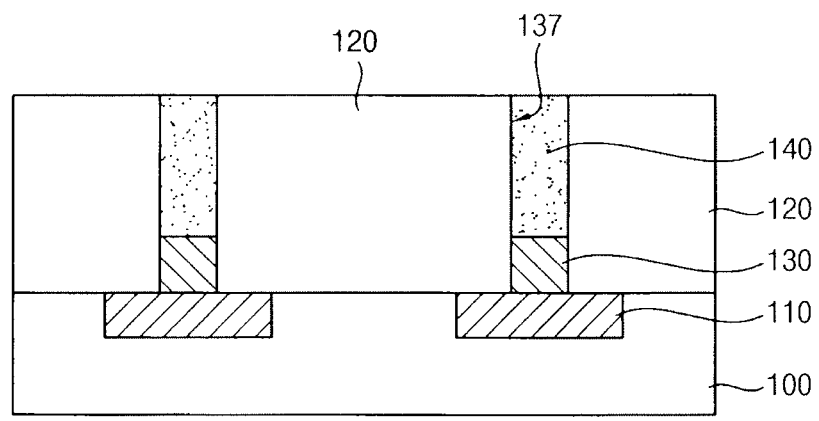

Referring to FIG. 9, a phase change material layer filling the second opening 137 may be formed on the lower electrode 130 and the insulating interlayer 120. An upper portion of the phase change material layer may be planarized by a CMP process or an etch-back process to form a phase change material pattern 140 filling the second opening 137 on the lower electrode 130.

The phase change material layer may be formed using a phase change material such as a chalcogen compound, e.g., GST or a chalcogen compound doped with carbon, nitrogen and/or a metal. The phase change material layer may be obtained by, e.g., one of a PVD process, an ALD process, or a sputtering process.

In exemplary embodiments, the second opening 137 may be formed by a selective wet etching process. Thus, a plurality of the second openings 137 may have a uniform width and depth. Therefore, disturbances or variations of both or one of a reset/set current and a Joule heat (e.g., transferred into the phase change material pattern 140 through the lower electrode 130) may be minimized.

Hereinafter, methods of forming a phase change structure according to comparative examples will be described.

Comparative Example

FIGS. 10 to 12B illustrate cross-sectional views depicting exemplary stages in methods of forming a phase change structure in accordance with comparative examples.

Figure 10:
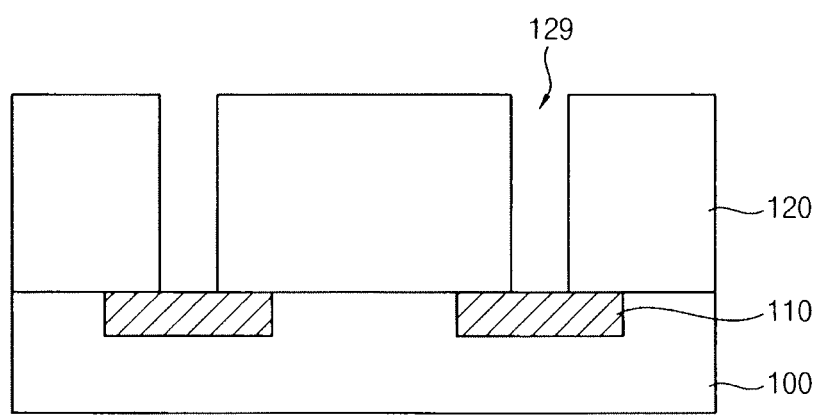
FIGS. 10, 11, 12A, and 12B illustrate cross-sectional views depicting stages in methods of forming a phase change structure in accordance with comparative examples.

Referring to FIG. 10, an insulating interlayer 120 may be formed on a substrate 100 including a conductive pattern 110. The insulating interlayer 120 may be partially removed to form a third opening 129 exposing the conductive pattern 110.

Figure 11:
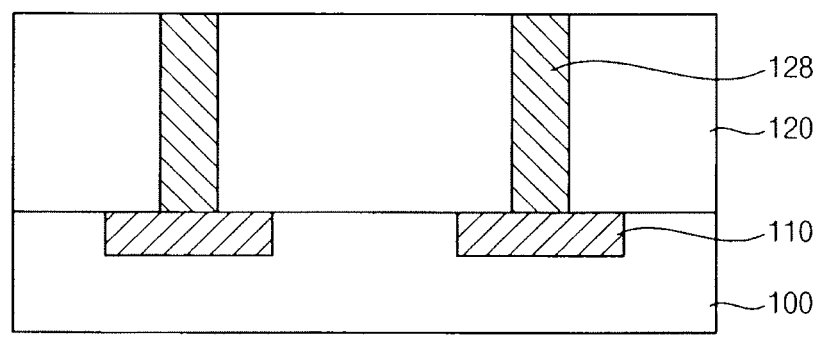

Referring to FIG. 11, a lower electrode layer filling the third opening 129 may be formed on the insulating interlayer 120 and the conductive pattern 110, and an upper portion of the lower electrode layer may be planarized to form a lower electrode layer pattern 128 in the third opening 129.

An upper portion of the lower electrode layer pattern 128 may be removed by a dry etching process or a wet etching process to form a lower electrode 130.

Figure 12A:
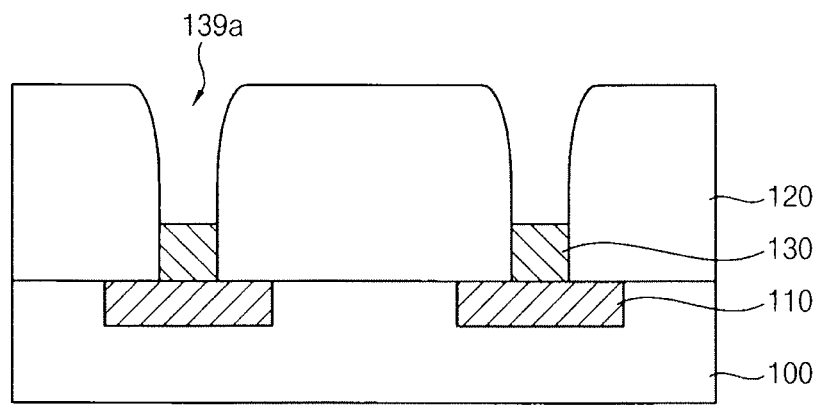

FIG. 12A illustrates a cross-sectional view of a state that the upper portion of the lower electrode layer pattern 128 is partially removed by the dry etching process.

Referring to FIG. 12A, the upper portion of the lower electrode layer pattern 128 may be removed by the dry etching process to form a fourth opening 139a and the lower electrode 130. While performing the dry etching process, an upper portion of the insulating interlayer 120 may be also removed because an etching selectivity between the insulating interlayer 120 including a silicon nitride or a silicon oxynitride and the lower electrode layer pattern 128 is very low. Accordingly, the fourth opening 139a may have a width increasing from a bottom portion to a top portion thereof as illustrated in FIG. 12A.

As a result, when a phase change material pattern is formed in the fourth opening 139a, the phase change material pattern may not have a uniform width. Further, a top surface of the lower electrode 130 may be damaged by the dry etching process to generate defects such as dents, protrusions, seams, voids thereon. That is, the lower electrode 130 may have an irregular top surface, and thus the phase change material pattern formed on the lower electrode 130 may also have an irregular bottom surface that mirrors the irregular top surface of the lower electrode 130.

Figure 12B:
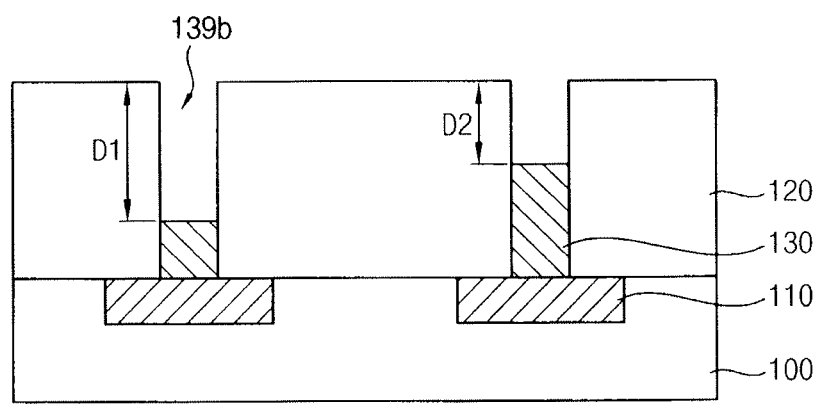

FIG. 12B illustrates a cross-sectional view of a state that the upper portion of the lower electrode layer pattern 128 is partially removed by the wet etching process.

Referring to FIG. 12B, the upper portion of the lower electrode layer pattern 128 may be removed by the wet etching process using an etching solution that has a higher etching rate for the lower electrode layer pattern 128 than for the insulating interlayer 120. Accordingly, a fifth opening 139b and a lower electrode 130 may be formed.

In this case, etching amounts of a plurality of the lower electrode layer patterns 128 may be different from each other, and thus a plurality of the fifth openings 139b may have different depths or heights (as indicated by "D1" and "D2" in FIG. 12B) from each other. Accordingly, when phase change material patterns are formed in the fifth openings 139b, the phase change material patterns may not have a uniform height.

According to the method of forming the phase change structure described with reference to FIGS. 2 to 9, the lower electrode 130 and the oxide layer pattern 135a contacting the lower electrode 130 may be formed before forming the second opening 137. The oxide layer pattern 135a may be removed by, e.g., a wet etching process to form the second opening 137 in which the phase change material pattern 140 is formed. That is, in contrast to the comparative examples, the lower electrode 130 may not be etched when forming the second opening 137. Therefore, the second opening 137 may have uniform width and depth so that the phase change material pattern 140 formed thereon may also have uniform width and height. The phase change structure including the phase change material pattern 140 may have reduced variations or distributions of current and heat, and further improved operational characteristics.

Figure 13A:
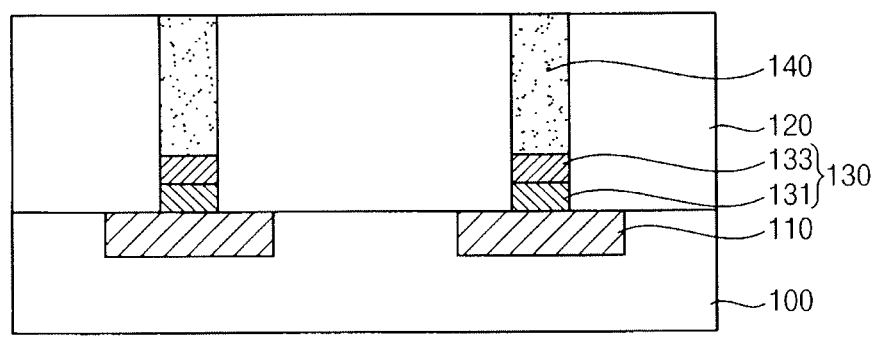
FIGS. 13A and 13B illustrate cross-sectional views of phase change structures in accordance with other exemplary embodiments.
Figure 13B:
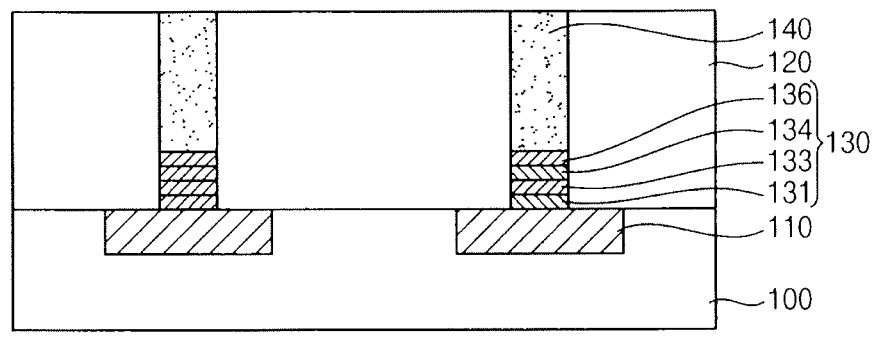

FIGS. 13A and 13B illustrate cross-sectional views of phase change structures in accordance with other exemplary embodiments. The phase change structures of FIGS. 13A and 13B may have constructions substantially the same as or similar to that illustrated in FIG. 1 except for a shape of a lower electrode. Thus, like reference numerals refer to the like elements, and repeated detailed descriptions thereof are omitted.

Referring to FIG. 13A, a lower electrode 130 may include a first pattern 131 containing a metal nitride or a metal silicon nitride and a second pattern 133 containing a metal. The first and second patterns 131 and 133 may be sequentially stacked on the conductive pattern 110. The first pattern 131 may have a same width as the second pattern 133.

In exemplary embodiments, the first pattern 131 may include a titanium nitride or a titanium silicon nitride and the second pattern 133 may include aluminum or tungsten.

Referring to FIG. 13B, the lower electrode 130 may further include a third pattern 134 containing a metal nitride or a metal silicon nitride. The composition of the third pattern 134 may be the same as or different from the composition of the first pattern 131. For example, if the first pattern 131 includes a metal nitride, the third pattern 134 may include the same metal nitride, a different metal nitride, or a metal silicon nitride. According to an exemplary embodiment, the first pattern 131 may include a titanium nitride or a titanium silicon nitride, and the third pattern 134 may include the same or the other of the titanium nitride and the titanium silicon nitride. The third pattern 134 may have substantially a same width as the second pattern 133.

The lower electrode 130 may further include a fourth pattern 136 containing a metal on the third pattern 134. The composition of the fourth pattern 136 may be the same as or different from the composition of the second pattern 133. For example, if the second pattern 133 includes a metal, the fourth pattern 136 may include the same metal or a different metal. According to an exemplary embodiment, the second pattern 133 may include aluminum or tungsten, and the fourth pattern 136 may include the same or the other of the aluminum or tungsten. The fourth pattern 136 may have substantially the same width as the third pattern 134 and the second pattern 133.

The lower electrode 130 may have a multilayered structure, e.g., a multi-stacked structure. The multilayered structure may include a plurality of patterns stacked therein, so that each of the patterns may have substantially a same width, e.g., lateral sides of the each of the patterns may be vertically aligned to form one continuous lateral side of the lower electrode. The lower electrode 130 may have the multi-stacked structure of, e.g., metal nitride (metal silicon nitride)/metal, metal nitride (metal silicon nitride)/metal/metal nitride (metal silicon nitride), or metal nitride (metal silicon nitride)/metal/metal nitride (metal silicon nitride)/metal.

Figure 14:
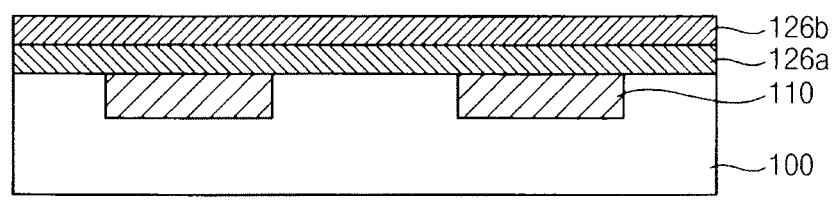
FIGS. 14 and 15 illustrate cross-sectional views depicting exemplary stages in methods of forming the phase change structure of FIG. 13.
Figure 15:
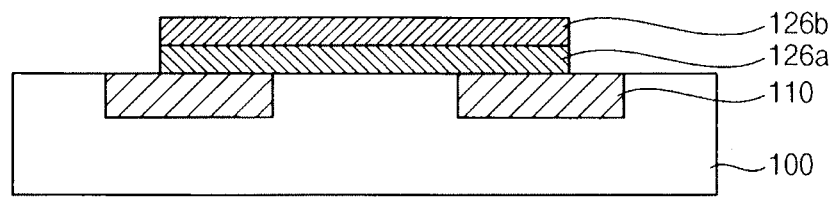

FIGS. 14 and 15 illustrate cross-sectional views depicting exemplary stages in methods of forming the phase change structure of FIGS. 13A and 13B.

Referring to FIG. 14, a first conductive layer 126a and a second conductive layer 126b may be sequentially formed on a substrate 100 including the conductive pattern 110.

The first conductive layer 126a may be formed using a metal nitride such as a titanium nitride and a metal silicon nitride such as a titanium silicon nitride by, e.g., at least one of an ALD process, a PVD process, a sputtering process, etc. The second conductive layer 126b may be formed using a metal such as aluminum or tungsten by, e.g., at least one of an ALD process, a PVD process, a sputtering process, etc.

In some exemplary embodiments, a third conductive layer (not illustrated) including a metal nitride or a metal silicon nitride may be further formed on the second conductive layer 126b. A fourth conductive layer (not illustrated) including a metal may be further formed on the third conductive layer.

Referring to FIG. 15, a mask pattern (not illustrated) may be formed on the second conductive layer 126b, and the second conductive layer 126b and the first conductive layer 126a may be partially etched using the mask pattern as an etching mask. Thus, the first and second conductive layers 126a and 126b may remain on portions of the two neighboring conductive patterns 110 and the substrate 100 therebetween.

Processes substantially the same as or similar to those illustrated with reference to FIGS. 4 to 9 may be performed so that the phase change structure of FIG. 13 may be obtained. That is, the first and second conductive layers 126a and 126b may be transformed into the first and second patterns 131 and 133, respectively, of the lower electrode 130.

Figure 16:
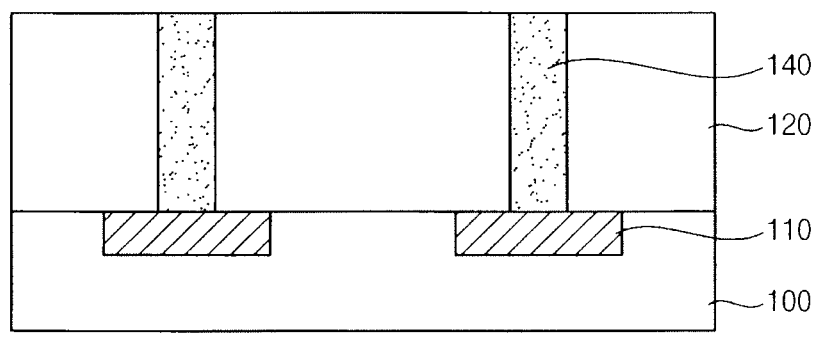
FIG. 16 illustrates a cross-sectional view of a phase change structure in accordance with exemplary embodiments.

FIG. 16 illustrates a cross-sectional view of a phase change structure in accordance with still other exemplary embodiments.

Referring to FIG. 16, the phase change structure may include a phase change material pattern 140 and may not include a lower electrode when compared to the phase change structure of FIG. 1.

When a conductive pattern 110 is formed using a metal such as tungsten or aluminum by a deposition process, defects including voids, seams, etc., may be generated in the conductive pattern 110. Thus, as illustrated in FIG. 1, the lower electrode 130 may be formed between the conductive pattern 110 and the phase change material pattern 140 for a uniform transfer of current and/or heat into the phase change material pattern 140.

According to exemplary embodiments, the phase change material pattern 140 may be formed to have a uniform width and a uniform height while having a minute width. Thus, the transfer of heat into the phase change material pattern 140 may be maximized and variations or distributions of current and heat may be minimized. Therefore, a phase change memory device including the phase change structure may have improved operational characteristics even though the phase change material pattern 140 is formed directly on the conductive pattern 110 without an assistance of the lower electrode 130.

FIGS. 17 to 22 illustrate cross-sectional views depicting exemplary methods of forming the phase change structure of FIG. 16. Detailed descriptions about processes substantially the same as or similar to those illustrated with reference to FIGS. 2 to 9 are omitted.

Figure 17:
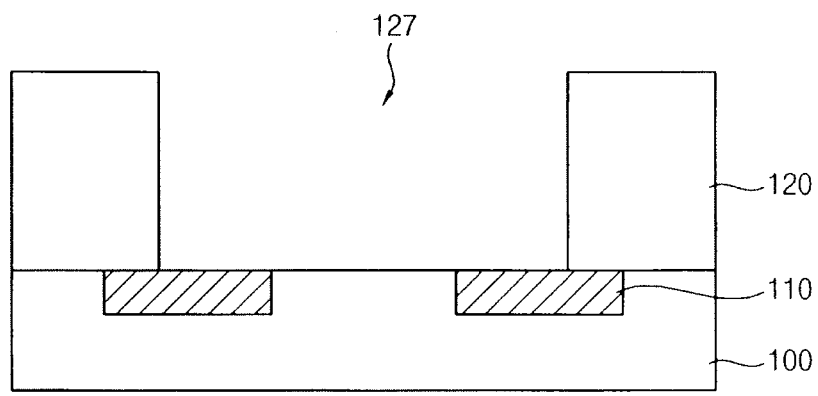
FIGS. 17 to 22 illustrate cross-sectional views depicting exemplary stages in methods of forming the phase change structure of FIG. 16.

Referring to FIG. 17, an insulating interlayer 120 may be formed on a substrate 100 including a conductive pattern 110. A photoresist pattern (not illustrated) may be formed on the insulating interlayer 120 and the insulating interlayer 120 may be partially removed using the photoresist pattern as an etching mask to form a first opening 127. Portions of the two neighboring conductive patterns 110 and the substrate 100 therebetween may be exposed by the first opening 127.

Figure 18:
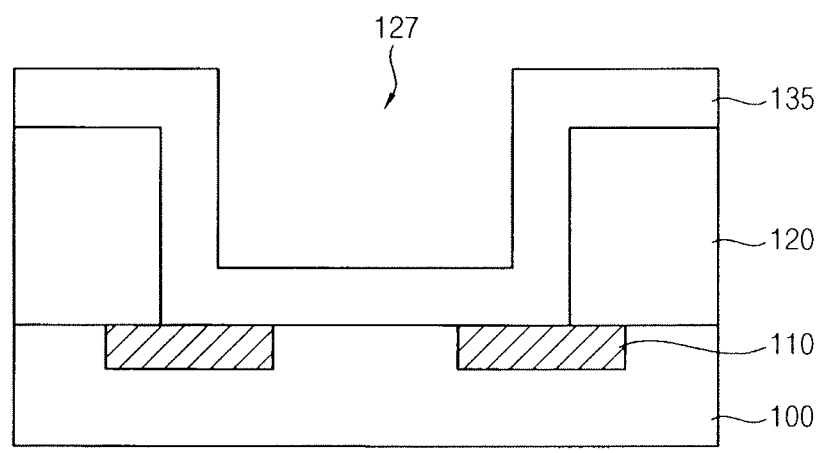

Referring to FIG. 18, an oxide layer 135 may be formed on a top surface of the insulating interlayer 120 and on a sidewall and a bottom of the first opening 127. In exemplary embodiments, the oxide layer 135 may have a uniform thickness of about 10 nm to about 20 nm.

The oxide layer 135 may be formed using silicon oxide such as BPSG, PSG, USG, SOG, FOX, TEOS, PE-TEOS, HDP-CVD oxide, etc. The oxide layer 135 may be obtained by, e.g., at least one of a CVD process, an LPCVD process, a PECVD process, HDP-CVD process, etc.

Figure 19:
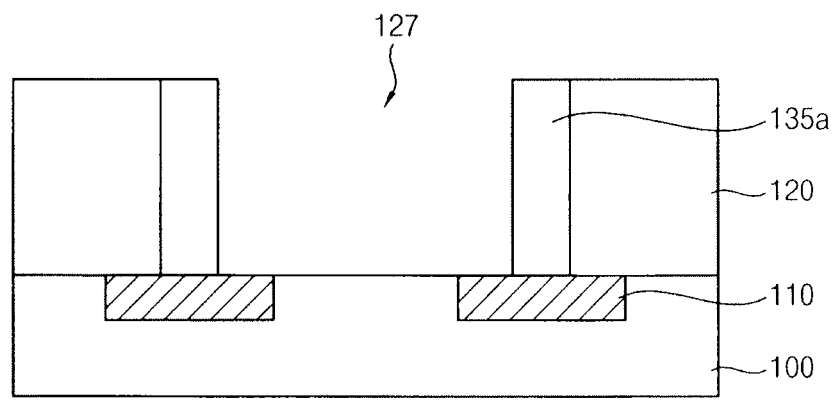

Referring to FIG. 19, portions of the oxide layer 135 formed on the top surface of the insulating interlayer 120 and on the bottom of the first opening 127 may be removed by an etch-back process. An upper portion of the insulating interlayer 120 may be also partially removed. By partially removing the oxide layer 135, an oxide layer pattern 135a may be formed on the sidewall of the first opening 127 and on the conductive pattern 110. A height of each of the oxide layer patterns 135a may be substantially the same.

Figure 20:
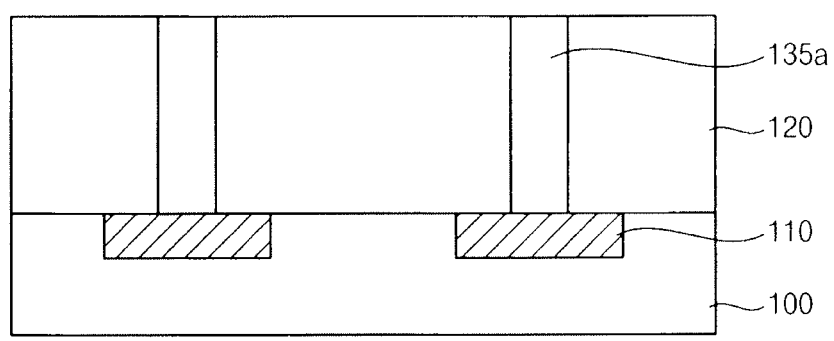

Referring to FIG. 20, an insulation layer filling the first opening 127 may be formed on the conductive pattern 110, the insulating interlayer 120, and the oxide layer pattern 135a. In exemplary embodiments, the insulation layer may be formed using a material substantially the same as that of the insulating interlayer 120, and thus the insulation layer may be merged with the insulating interlayer 120. An upper portion of the insulation layer may be planarized until top surfaces of the insulating interlayer 120 and the oxide layer pattern 135a are exposed by, e.g., a CMP process or an etch-back process.

Figure 21:
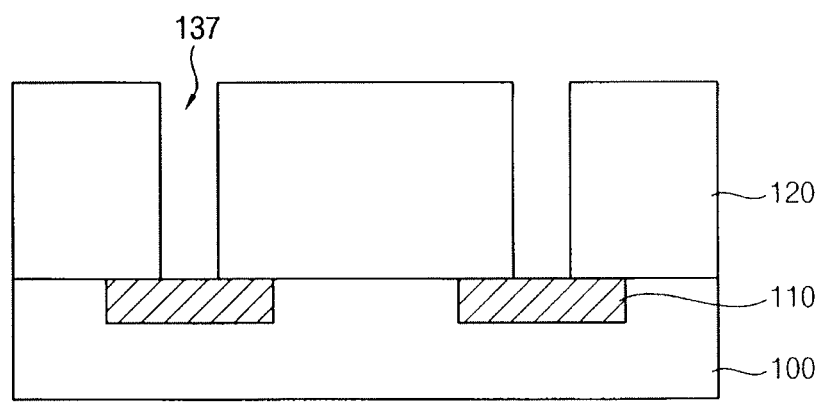

Referring to FIG. 21, the oxide layer pattern 135a may be removed by a wet etching process to form a second opening 137. The wet etching process may be carried out using an etching solution that has a higher etching rate for the oxide layer pattern 135a than for the insulating interlayer 120. For example, the etching solution may include a LAL solution, a hydrofluoric acid solution, or a BOE solution.

Figure 22:
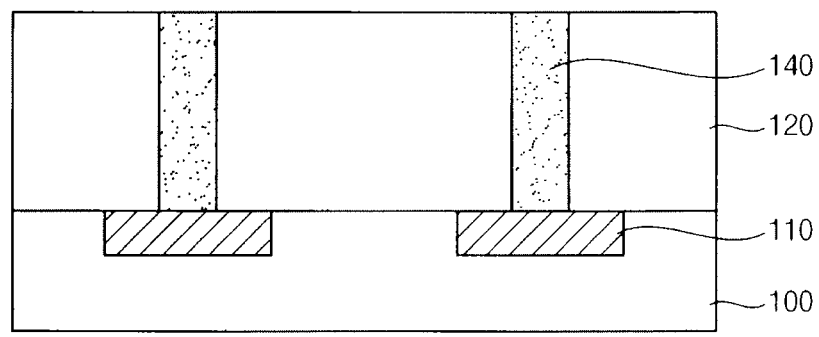

Referring to FIG. 22, a phase change material layer filling the second opening 137 may be formed on the insulating interlayer 120 and the conductive pattern 110. An upper portion of the phase change material layer may be planarized by, e.g., a CMP process or an etch-back process, to form a phase change material pattern 140 contacting the conductive pattern 110 in the second opening 137.

Phase Change Memory Devices and Methods of Manufacturing the Same

Figure 23:
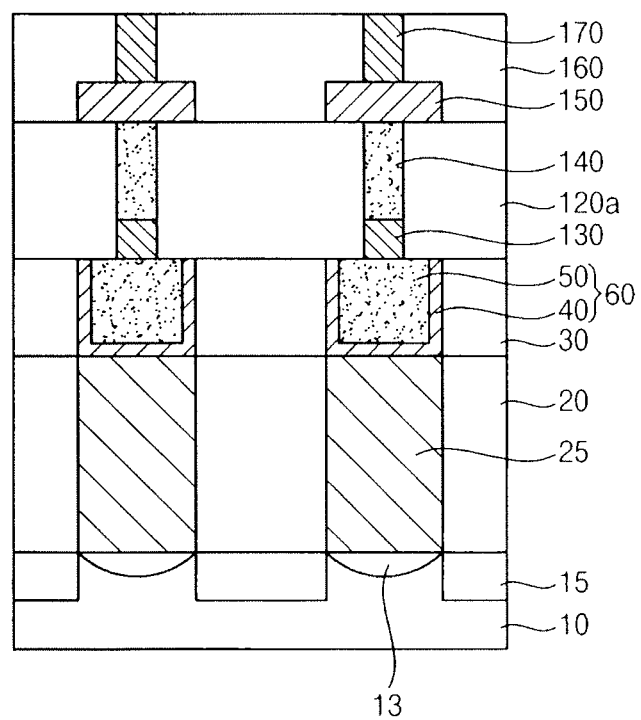
FIG. 23 illustrates a cross-sectional view of a phase change memory device in accordance with exemplary embodiments.

FIG. 23 illustrates a cross-sectional view of a phase change memory device in accordance with exemplary embodiments. Referring to FIG. 23, the phase change memory device may include a substrate 10, a conductive structure 25, a conductive pattern 60, a lower electrode 130, a phase change material pattern 140, an upper electrode 150, and an upper electrode contact 170.

An isolation layer 15 may be formed on the substrate 10 to define an active region of the substrate 10. An impurity region 13 may be formed at an upper portion of the substrate 10 in the active region. The impurity region 13 may be formed in a region of the substrate 10 that excludes the isolation layer 15 and that is under the conductive structure 25.

A first insulating interlayer 20 may be disposed on the substrate 10. The conductive structure 25 may make contact with the impurity region 13 through the first insulating interlayer 20, e.g., the conductive structure 25 may be completely surrounded by the first insulating interlayer 20.

In an exemplary embodiment, the conductive structure 25 may include a P-N diode. For example, N-type impurities may be implanted into a lower portion of the conductive structure 25 and P-type impurities may be implanted into an upper portion of the conductive structure 25 to form the P-N diode. However, embodiments are not limited thereto.

In an exemplary embodiment, a metal silicide pattern (not illustrated) may be further formed at the upper portion of the conductive structure 25. A resistance between the conductive structure 25 and the conductive pattern 60 may be reduced by the metal silicide pattern (not illustrated).

A second insulating interlayer 30 may be disposed on the first insulating interlayer 20 and the conductive structure 25. The conductive pattern 60 may make contact with the conductive structure 25 through the second insulating interlayer 30. The conductive pattern 60 may be similar to the conductive pattern 110 formed in the substrate 100, as illustrated in, e.g., FIG. 1. Accordingly, a phase change structure may be formed on the conductive pattern 60.

In exemplary embodiments, the conductive pattern 60 may include a barrier metal layer pattern 40 and a metal layer pattern 50. The barrier metal layer pattern 40 may include, e.g., titanium, a titanium nitride, etc. The barrier metal layer pattern 40 may have a multi-layered structure including these materials. The barrier metal layer pattern 40 may cover sidewalls and a bottom surface of an opening in the second insulating interlayer 30. In exemplary embodiments, the barrier metal layer pattern 40 may have a substantially cup shape. The barrier metal layer pattern 40 may minimize and/or prevent a metal from being diffused into the insulating interlayers. The metal layer pattern 50 may include a metal such as tungsten, aluminum, etc. The barrier metal layer pattern 40 may enclose a sidewall and a bottom of the metal layer pattern 50. A portion of the barrier metal layer pattern 40 may be between the metal layer pattern 50 and the conductive structure 25.

In one exemplary embodiment, a metal oxide pattern (not illustrated) may be further formed at an upper portion of the metal layer pattern 50. A resistance of the conductive pattern 60 may be increased by the metal oxide pattern so that, e.g., an efficiency of a Joule heat generated from the lower electrode 130 may be enhanced.

The lower electrode 130 may make contact with the metal layer pattern 50 as illustrated in FIG. 23. However, the lower electrode 130 may make contact with both top surfaces of the metal layer pattern 50 and the barrier metal layer pattern 40.

A third insulating interlayer 120a may be disposed on the second insulating interlayer 30 and the conductive pattern 60. An opening (not illustrated) may be formed through the third insulating interlayer 120a. The lower electrode 130 contacting the conductive pattern 60 and the phase change material pattern 140 contacting the lower electrode 130 may be disposed in the opening. Structures of the third insulating interlayer 120a, the lower electrode 130, and the phase change material pattern 140 may be substantially the same as or similar to those illustrated with reference to, e.g., FIG. 1. Thus, repeated detailed descriptions thereof are omitted. The third insulating interlayer 120a may correspond to the insulating interlayer 120 of FIG. 1.

The upper electrode 150 may be disposed on the third insulating interlayer 120a and the phase change material pattern 140. For example, the upper electrode 150 may include tungsten (W), aluminum (Al), copper (Cu), tantalum (Ta), titanium (Ti), molybdenum (Mo), niobium (Nb), zirconium (Zr), a tungsten nitride, an aluminum nitride, a tantalum nitride, a molybdenum nitride, a niobium nitride, a zirconium nitride, etc. These may be used alone or in a mixture thereof.

A fourth insulating interlayer 160 may be disposed on the third insulating interlayer 120a and the upper electrode 150. The upper electrode contact 170 contacting the upper electrode 150 may be formed through the fourth insulating interlayer 160. The upper electrode contact 170 may include a metal such as at least one of tungsten, aluminum, copper, tantalum, titanium, molybdenum, niobium, zirconium, etc.

FIGS. 24 to 28 illustrate cross-sectional views depicting exemplary stages in methods of manufacturing the phase change memory device of FIG. 23.

Figure 24:
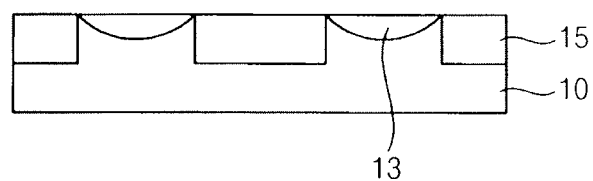
FIGS. 24 to 28 illustrate cross-sectional views depicting exemplary stages in methods of manufacturing the phase change memory device of FIG. 23.

Referring to FIG. 24, N-type impurities may be implanted into an upper portion of a substrate 10. The isolation layer 15 may be formed on the substrate 10 by, e.g., a shallow trench isolation (STI) process, to form the impurity region 13.

Figure 25:
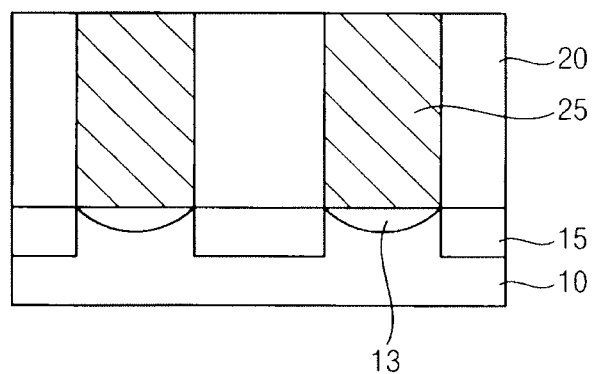

Referring to FIG. 25, the first insulating interlayer 20 may be formed on the substrate 10. The conductive structure 25 contacting the impurity region 13 may be formed through the first insulating interlayer 20. For example, the first insulating interlayer 20 may be formed using silicon oxide by, e.g., a CVD process. The first insulating interlayer 20 may be partially removed by, e.g., a photolithography process to form an opening (not illustrated) exposing the impurity region 13.

A polysilicon layer filling the opening may be formed on the first insulating interlayer 20 and the impurity region 13. An upper portion of the polysilicon layer may be planarized until a top surface of the first insulating interlayer 20 is exposed to form a polysilicon layer pattern in the opening. N-type impurities may be implanted at a lower portion of the polysilicon layer pattern and P-type impurities may be implanted at an upper portion of the polysilicon layer pattern, so that a P-N diode may be formed in the opening. That is, the P-N diode may serve as the conductive structure 25.

Alternatively, a conductive layer filling the opening may be formed by a selective epitaxial growth (SEG) process in which the impurity region 13 may serve as a seed. An upper portion of the conductive layer may be planarized to form the conductive structure 25.

In one exemplary embodiment, a metal silicide pattern (not illustrated) may be further formed at an upper portion of the conductive structure 25. For example, a metal layer (not illustrated) may be deposited on the conductive structure 25. The metal layer may be reacted with polysilicon contained in the conductive structure 25 by a heat treatment to form the metal silicide pattern. The metal silicide pattern may include, e.g., a cobalt silicide, a titanium silicide, etc.

Figure 26:
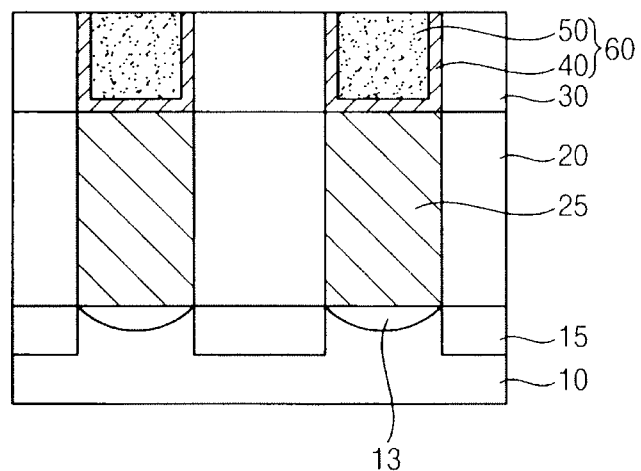

Referring to FIG. 26, a second insulating interlayer 30 may be formed on the first insulating interlayer 20 and the conductive structure 25. A conductive pattern 60 contacting the conductive structure 25 may be formed through the second insulating interlayer 30.

For example, the second insulating interlayer 30 may be formed using silicon oxide by, e.g., a CVD process. The second insulating interlayer 30 may be partially removed by, e.g., a photolithography process to form an opening (not illustrated) exposing the conductive structure 25.

A barrier metal layer may be formed on a top surface of the second insulating interlayer 30 and on a sidewall and a bottom of the opening. A metal layer filling a remaining portion of the opening may be formed on the barrier metal layer.

In exemplary embodiments, the barrier metal layer may be formed using a titanium nitride or titanium by, e.g., at least one of an ALD process, a sputtering process, a PVD process, etc. The metal layer may be formed using a metal such as tungsten or aluminum by, e.g., at least one of an ALD process, a sputtering process, a PVD process, etc.

Upper portions of the metal layer and the barrier metal layer may be planarized until a top surface of the second insulating interlayer 30 is exposed to form the barrier metal layer pattern 40 and the metal layer pattern 50. In exemplary embodiments, the barrier metal layer pattern 40 may enclose a bottom and a sidewall of the metal layer pattern 50. The barrier metal layer pattern 40 and the metal layer pattern 50 may define the conductive pattern 60.

Figure 27:
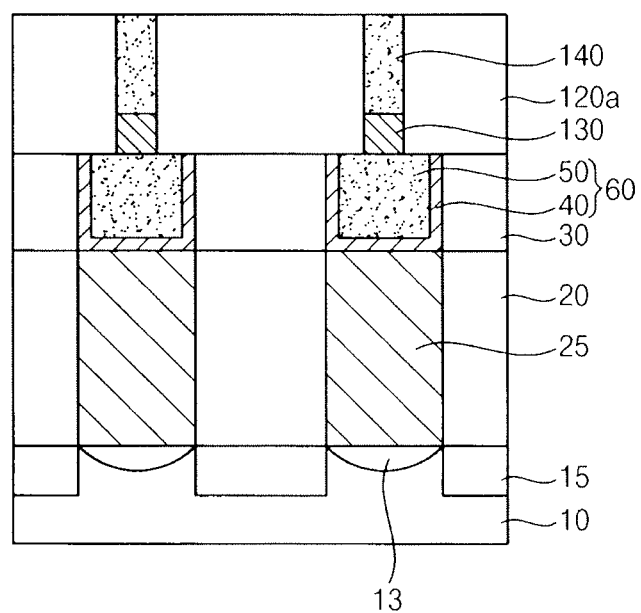

Referring to FIG. 27, processes substantially the same as or similar to those illustrated with reference to, e.g., FIGS. 2 to 9 may be performed. Accordingly, the third insulating interlayer 120a may be formed on the second insulating interlayer 30 and the conductive pattern 60. The lower electrode 130 contacting the conductive pattern 60 and the phase change material pattern 140 contacting the lower electrode 130 may be formed.

Figure 28:
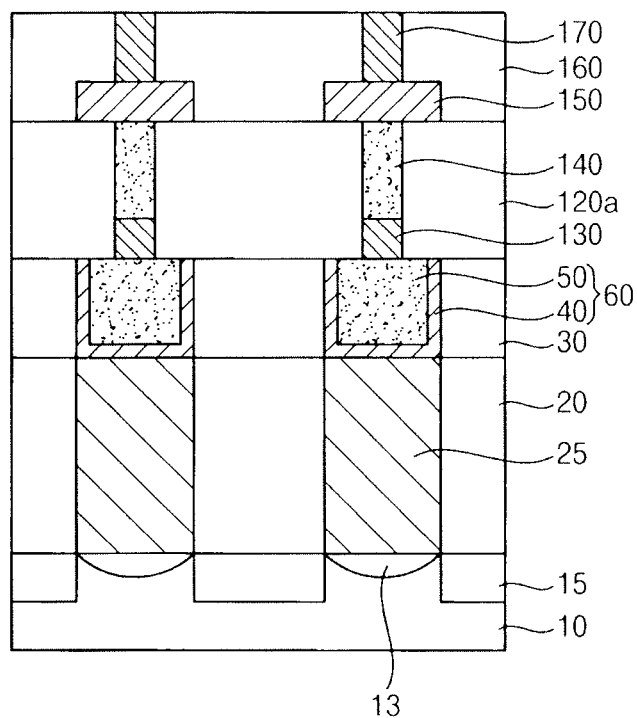

Referring to FIG. 28, the upper electrode 150 connected to the phase change material pattern 140 and the upper electrode contact 170 may be formed. The upper electrode 150 may completely overlap the phase change material pattern 140. The upper electrode 150 may have a greater width than the phase change material pattern 140.

For example, an upper electrode layer may be formed on the third insulating interlayer 120a and the phase change material pattern 140. The upper electrode layer may be formed using a metal or a metal nitride such as tungsten, aluminum, copper, tantalum, titanium, molybdenum, niobium, zirconium, a tungsten nitride, an aluminum nitride, a tantalum nitride, a molybdenum nitride, a niobium nitride, a zirconium nitride, etc. The upper electrode layer may be obtained by, e.g., at least one of an ALD process, a PVD process, etc. The upper electrode layer may be patterned to form the upper electrode 150 contacting the phase change material pattern 140.

A fourth insulating interlayer 160 covering the upper electrode 150 may be formed on the third insulating interlayer 120a. For example, the fourth insulating interlayer 160 may be formed using a silicon oxide by a CVD process.

The fourth insulating interlayer 160 may be partially removed to form an opening (not illustrated) partially exposing the upper electrode 150. The opening may be filled with a metal such as tungsten, aluminum, copper, tantalum, titanium, molybdenum, niobium, zirconium, etc., to form the upper electrode contact 170.

In exemplary embodiments, a bit line (not illustrated), a metal wiring (not illustrated) or a pad (not illustrated) connected with the upper electrode contact 170 may be further formed.

Figure 29:
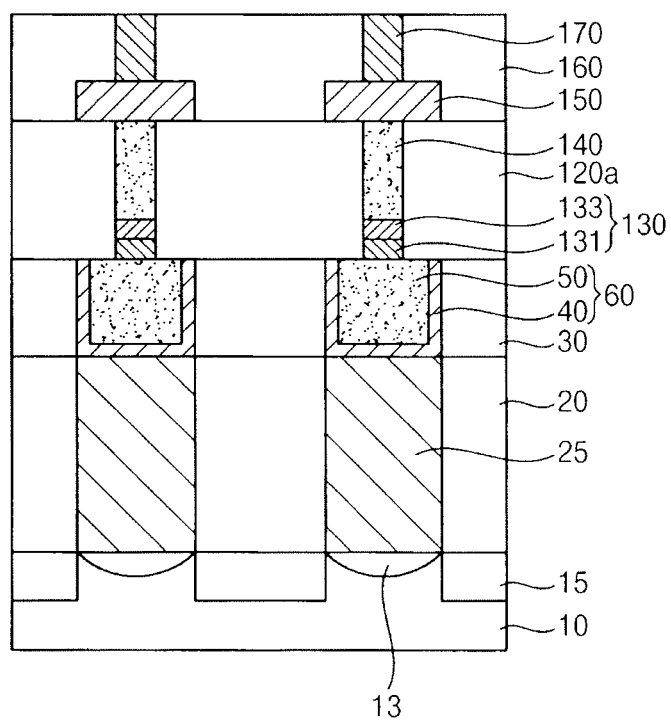
FIG. 29 illustrates a cross-sectional view of a phase change memory device in accordance with exemplary embodiments.

FIG. 29 illustrates a cross-sectional view of a phase change memory device in accordance with other exemplary embodiments. The phase change memory device of FIG. 29 may have a construction substantially the same as or similar to that illustrated with reference to FIG. 23 except for a structure of a lower electrode. Thus, like reference numerals in the drawings denote like elements, and repeated detailed descriptions thereof are omitted.

Referring to FIG. 29, a lower electrode 130 may have a multi-stacked structure including a first pattern 131 and a second pattern 133, e.g., as described with reference to FIG. 13. In exemplary embodiments, the first pattern 131 may include, e.g., a titanium nitride or a titanium silicon nitride, and the second pattern 133 may include, e.g., aluminum or tungsten.

In some exemplary embodiments, the lower electrode 130 may further include a third pattern (not illustrated) containing a metal nitride or a metal silicon nitride on the second pattern 133. A fourth pattern (not illustrated) including a metal may be further disposed on the third pattern. That is, the lower electrode 130 may have a multi-stacked structure of, e.g., metal nitride (metal silicon nitride)/metal, metal nitride (metal silicon nitride)/metal/metal nitride (metal silicon nitride), or metal nitride (metal silicon nitride)/metal/metal nitride (metal silicon nitride)/metal.

Hereinafter, a method of manufacturing the phase change memory device of FIG. 29 is described.

Processes substantially the same as or similar to those illustrated with reference to FIGS. 24 to 26 may be performed to form a conductive structure 25 on a substrate 10 and a conductive pattern 60 contacting the conductive structure 25. Processes substantially the same as or similar to those illustrated with reference to FIGS. 14 and 15 may also be performed to form the lower electrode 130. Accordingly, the lower electrode 130 including the first pattern 131 and the second pattern 133 may be formed on the conductive pattern 60, and a phase change material pattern 140 may be formed on the lower electrode 130. Processes substantially the same as or similar to those illustrated with reference to FIG. 28 may be performed to form an upper electrode 150 and an upper electrode contact 170.

Figure 30:
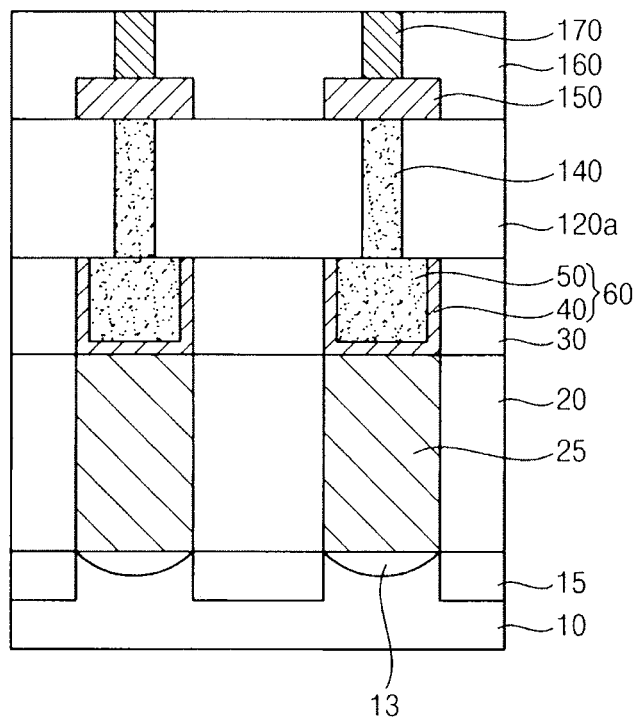
FIG. 30 illustrates a cross-sectional view of a phase change memory device in accordance with exemplary embodiments.

FIG. 30 illustrates a cross-sectional view of a phase change memory device in accordance with still other exemplary embodiments.

The phase change memory device of FIG. 30 may have a construction substantially the same as or similar to that illustrated in FIG. 23 except that a lower electrode 130 may not be formed and a phase change material pattern 140 may be formed directly on a conductive pattern 60.

Hereinafter, a method of manufacturing the phase change memory device of FIG. 30 is described.

Processes substantially the same as or similar to those illustrated with reference to FIGS. 24 to 26 to form a conductive structure 25 on a substrate 10 and a conductive pattern 60 contacting the conductive structure 25. Processes substantially the same as or similar to those illustrated with reference to FIGS. 17 to 22 may be performed to form the phase change material pattern 140 directly contacting the conductive pattern 60, e.g., directly contacting the metal layer pattern 50. Processes substantially the same as or similar to those illustrated with reference to FIG. 28 may be performed to form an upper electrode 150 and an upper electrode contact 170.

By way of summation and review, in a phase change memory device, to produce the Joule heat more efficiently by a small current, a lower electrode may be formed to have a small cross-section area. However, the lower electrode having the small cross-section area may not be easily formed because of a limited resolution of a photolithography process. Further, a top surface of the lower electrode may have etching damage thereon due to the photolithography process. Thus, the phase change material pattern formed thereon may have, e.g., an irregular line width and/or an irregular height.

In a conventional method of forming a phase change material pattern, an opening may be formed through an insulating interlayer and a lower electrode may be formed in the opening. An upper portion of the lower electrode may be partially etched. A phase change material pattern filling a remaining portion of the opening may be formed on the lower electrode. In the above-mentioned method, the lower electrode may not be uniformly etched, and thus the phase change material pattern thereon may have an irregular height and/or an irregular width.

In contrast, exemplary embodiments relate to forming an insulating interlayer that covers a lower electrode layer, the insulating interlayer may be partially removed to form a first opening exposing the lower electrode layer, an oxide layer may be formed on the lower electrode layer and on a sidewall of the first opening, and the oxide layer may be partially removed by an etch-back process together with a portion of the lower electrode layer beneath the oxide layer. Accordingly, an oxide layer pattern may remain on the sidewall of the first opening, and a lower electrode layer may be formed beneath the oxide layer pattern. The oxide layer pattern may be removed by a wet etching process to form a second opening exposing the lower electrode. A phase change material pattern filling the second opening may be formed on the lower electrode.

An etching process may not be performed directly on the lower electrode so that the lower electrode may have a uniform top surface and the phase change material pattern thereon may have a uniform width and a uniform height. Further, the phase change material pattern may have a uniform line width and height so that variations or distributions of reset/set current and resistance may be reduced. As a result, a phase change memory device including the phase change material pattern may have enhanced and/or improved operational characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a phase change memory device, the method comprising:
    forming a lower electrode layer pattern on a substrate;
    forming an insulating interlayer covering the lower electrode layer pattern on the substrate;
    partially removing the insulating interlayer to form a first opening, the first opening exposing the lower electrode layer pattern;
    forming an oxide layer on the lower electrode layer pattern and on a sidewall of the first opening;
    partially removing the oxide layer and the lower electrode layer pattern to form an oxide layer pattern on the sidewall of the first opening and a lower electrode under the oxide layer pattern;
    forming an insulation layer filling a remaining portion of the first opening on the substrate;
    removing the oxide layer pattern by a wet etching process to form a second opening, the second opening exposing a top surface of the lower electrode; and
    forming a phase change material pattern on the lower electrode such that the phase change material pattern fills the second opening.

2. The method as claimed in claim 1, wherein the wet etching process is performed using an etching solution that has a higher etching rate for the oxide layer pattern than for the insulating interlayer and the insulation layer.

3. The method as claimed in claim 2, wherein the etching solution includes a hydrofluoric acid solution or a buffer oxide etchant solution.

4. The method as claimed in claim 1, wherein the insulating interlayer and the insulation layer are formed using a silicon nitride or a silicon oxynitride.

5. The method as claimed in claim 1, further comprising forming a plurality of conductive patterns on the substrate such that at least one pair of neighboring conductive patterns are formed on the substrate, the lower electrode layer pattern being formed on portions of the pair of neighboring conductive patterns and on a portion of the substrate between the pair of neighboring conductive patterns.

6. The method as claimed in claim 5, wherein partially removing the oxide layer and the lower electrode layer pattern exposes the portions of the pair of neighboring conductive patterns and the portion of the substrate between the pair of neighboring conductive patterns.

7. The method as claimed in claim 5, wherein forming the plurality of conductive patterns includes:
    forming a barrier metal layer pattern on the substrate such that the barrier metal layer pattern has a cup shape, and
    forming a metal layer pattern on the barrier metal layer pattern such that a sidewall and a bottom surface of the metal layer pattern are surrounded by the barrier metal layer pattern.

8. The method as claimed in claim 7, wherein the lower electrode is in contact with a top surface of the metal layer pattern.

9. The method as claimed in claim 1, wherein forming the lower electrode layer pattern includes:
    forming a first conductive layer on the substrate, the first conductive layer including a metal nitride or a metal silicon nitride,
    forming a second conductive layer on the first conductive layer, the second conductive layer including a metal, and
    partially etching the first conductive layer and the second conductive layer.

10. A method of manufacturing a phase change memory device, the method comprising:
    providing a substrate, the substrate having a pair of adjacent conductive patterns thereon;
    forming an insulating interlayer including a first opening, the first opening exposing portions of the pair of adjacent conductive patterns or a lower electrode layer pattern on the substrate that overlaps the portions of the pair of adjacent conductive patterns;

forming oxide layer patterns on a sidewall of the first opening such that each oxide layer pattern overlaps one of the pair of adjacent conductive patterns;

forming an insulation layer on the oxide layer patterns such that the insulation layer fills the first opening;

removing the oxide layer patterns by a wet etching process to form second openings; and filling the second openings with a phase change material to form phase change material patterns on the substrate.

11. The method as claimed in claim 10, wherein the insulation layer is formed to abut the oxide layer patterns in the first opening such that the insulation layer and the oxide layer patterns completely fill the first opening.

12. The method as claimed in claim 11, wherein the first opening is filled with the oxide layer patterns and the insulation layer before the second openings are formed.

13. The method as claimed in claim 10, wherein, before forming the insulation layer, forming the oxide layer patterns includes:

forming an oxide layer in the first opening, the oxide layer covering a bottom surface of the first opening and the sidewall of the first opening, and partially removing the oxide layer such that the oxide layer patterns on the sidewall of the first opening remains.

14. The method as claimed in claim 10, wherein a width of the first opening is greater than a width of the second opening.

* * * * *